United States Patent
Lee et al.

(10) Patent No.: US 6,278,649 B1
(45) Date of Patent: Aug. 21, 2001

(54) BANK SELECTION STRUCTURES FOR A MEMORY ARRAY, INCLUDING A FLAT CELL ROM ARRAY

(75) Inventors: Yu-Wei Lee, Taichung; Nien-Chao Yang, Hsinchu, both of (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/607,730

(22) Filed: Jun. 30, 2000

(51) Int. Cl.[7] ................................................. G11C 8/00
(52) U.S. Cl. ........................ 365/230.03; 365/104; 365/72
(58) Field of Search .............................. 365/230.03, 104, 365/63, 51, 72, 103

(56) References Cited

U.S. PATENT DOCUMENTS

| | | | |
|---|---|---|---|
| 5,117,389 | 5/1992 | Yiu .................................... | 365/104 |
| 5,202,848 | 4/1993 | Nakagawara ..................... | 365/104 |
| 5,317,534 | 5/1994 | Choi et al. ........................ | 365/182 |
| 5,341,337 | 8/1994 | Hotta ................................. | 365/204 |
| 5,345,416 | 9/1994 | Nakagawara ..................... | 365/185 |
| 5,392,233 | 2/1995 | Iwase ................................ | 365/104 |
| 5,467,300 | 11/1995 | Komarek et al. ................. | 365/104 |
| 5,600,586 | 2/1997 | Lee .................................... | 365/104 |
| 5,621,697 | 4/1997 | Weng et al. ...................... | 365/230.06 |
| 5,625,586 | 4/1997 | Yamasaki et al. ................ | 365/104 |
| 5,650,959 | 7/1997 | Hayashi et al. .................. | 365/182 |
| 5,663,903 | 9/1997 | Guo .................................. | 365/104 |
| 5,790,450 | 8/1998 | Nishizaka et al. ............... | 365/104 |
| 5,812,440 | 9/1998 | Suminaga et al. ............... | 365/51 |
| 5,835,398 | 11/1998 | Hirose .............................. | 365/104 |
| 5,886,937 | 3/1999 | Jang ................................. | 365/203 |
| 5,926,432 | * 7/1999 | Kawai et al. .................... | 365/230.03 |

* cited by examiner

Primary Examiner—David Nelms
Assistant Examiner—David Lam
(74) Attorney, Agent, or Firm—Mark A. Haynes; Haynes & Beffel LLP

(57) ABSTRACT

An integrated circuit memory comprises an array of non-volatile memory cells arranged in rows and columns, and including a plurality of banks. There are a plurality of word lines along the plurality of rows in the array, and a plurality of array bit lines arranged along the plurality of columns. The array bit lines extend across the array, and include sense lines and ground lines. A plurality of bank bit lines is arranged along the plurality of columns. The bank bit lines extend across corresponding banks in the plurality of banks and are coupled to memory cells in the corresponding banks. A plurality of connection terminals are coupled to the array bit lines. For each array bit line there is at least one connection terminal per bank in the plurality of banks for which the array bit line will be used. A plurality of bank select transistors is provided to act as bank select circuitry. The bank select transistors are operable to selectively connect respective bank bit lines to corresponding connection terminals for array bit lines. The bank select transistors are characterized by allowing independent connection of bank bit lines to sense lines of the plurality of array bit lines, while minimizing the number of transistors in the sensing path. In embodiments described, the bank select transistors allow independent connection of the bank bit lines to both sense lines and ground lines in the plurality of array bit lines.

36 Claims, 10 Drawing Sheets

BANK SELECTION STRUCTURES FOR A MEMORY ARRAY, INCLUDING A FLAT CELL ROM ARRAY

BACKGROUND OF THE INVENTION

1. Field of the Invention

The present invention relates to high density, integrated circuit memory devices including flat cell ROM, and more particularly to structures for coupling banks of memory cells to array bit lines in which there are a plurality of columns of memory cells sharing each array bit line.

2. Description of Related Art

High-density integrated circuit memory designs often have an architecture that includes array bit lines, often called global bit lines, that extend across an array, and a number of shorter bank bit lines, often called local bit lines, that extend parallel to the array bit lines across a bank of memory cells in the array. For example, a bank bit line may extend across 32, 64 or 128 rows of memory cells in an array. Bank bit lines are typically implemented as diffusion regions in the substrate of the integrated circuit, and act as a source or drain for the memory cells to which they are coupled. The array bit lines are typically implemented as metal lines which extend over the array. Metal to diffusion contacts act as connection points for coupling the bank bit lines to the array bit lines. Bank select circuits are operated to connect a bank bit line to an array bit line in order to access a given memory cell on the bank bit line.

In the design of the bank select circuits, a number of factors is involved. The number of transistors through which the cell current must past through before connection with the array bit line affects the speed of operation of the device. The flexibility by which a given bank bit line may be coupled to one or more array bit lines affects the manner in which the individual cells may be accessed. Also, the design of the bank select circuits has a direct impact on the layout of the memory array. The bank select circuitry also determines whether a given bank bit line may be connected to ground or to a sense amplifier through array bit lines which may be dedicated to one or the other. Finally, the bank select circuitry may also limit the number of columns of memory cells which may be simultaneously coupled to sense amplifiers for high-speed, page mode implementations.

The prior art in this field includes U.S. Pat. No. 5,241,497; U.S. Pat. No. 5,117,389; U.S. Pat. No. 5,392,233; U.S. Pat. No. 5,812,440; and U.S. Pat. No. 5,392,233; and a large number of other references. A review of the bank selection circuitry for these prior art patents shows deficiencies in density, sensing speed or sensing flexibility of the prior art.

In modern memory design, such as for high-density, flat cell mask ROM for which speed of access is critical, the flexibility of the bank select structure becomes more critical. The bank select structure must involve as few transistors in the sensing path as possible to insure highest speed access to the data. Furthermore, in some designs, the number of array bit lines dedicated to ground terminals is reduced, and the need to share a ground line by more than one sense amplifier has arisen. Thus, the bank select structure must support the use of multiple sense amplifiers with a shared ground line, flexibility in the selection of memory cells to be accessed, high speed operation, and other aspects of high-density memories.

SUMMARY OF THE INVENTION

The present invention provides an integrated circuit memory having bank select circuitry that is suitable for high-density, high-speed memory such as flat cell mask ROM devices. The bank select circuitry is based on bank select transistors which allow for independently connecting, individually and in combination, the array bit lines with bank bit lines, while relying on a small number of transistors in the sensing path.

Thus, the present invention provides an integrated circuit memory that comprises an array of memory cells arranged in rows and columns, and including a plurality of banks. There are a plurality of word lines along the plurality of rows in the array, and a plurality of array bit lines arranged along the plurality of columns. The memory cells are non-volatile cells, a flat cell mask ROM in various embodiments of the invention. The array bit lines extend across the array, and include sense lines and ground lines. A plurality of bank bit lines is arranged along the plurality of columns. The bank bit lines extend across corresponding banks in the plurality of banks and are coupled to memory cells in the corresponding banks. A plurality of connection terminals are coupled to the array bit lines. For each array bit line there is at least one connection terminal per bank in the plurality of banks for which the array bit line will be used. A plurality of bank select transistors is provided to act as bank select circuitry. The bank select transistors are operable to selectively connect respective bank bit lines to corresponding connection terminals for array bit lines. The bank select transistors are characterized by allowing independent connection of bank bit lines to sense lines of the plurality of array bit lines, while minimizing the number of transistors in the sensing path. In another aspect, the bank select transistors allow independent connection of the bank bit lines to both sense lines and ground lines in the plurality of array bit lines.

Accordingly, the bank selection circuitry includes for a first particular connection terminal in the plurality of connection terminals on particular sense line and within a particular bank, bank select transistors coupled to the first particular connection terminal, and local bit line select lines coupled to the bank select transistors, by which a bank bit line LBx and a bank bit line LBx+2 are independently connectable to the particular sense line, and a bank bit line LBx+1 is connectable to the particular sense line. For a second particular connection terminal on a particular ground line and within the particular bank, the bank select transistors are coupled to the second particular connection terminal and to local ground select lines. The bank bit line LBx and the bank bit line LBx−2 are independently connectable to the particular ground line, and the bank bit line LBx−1 is connectable to the particular ground line as well.

According to one aspect of invention, each of the connection terminals is associated with three bank select transistors and three local bit line select lines. Thus for example for the first particular connection terminal in this aspect of invention there are three bank select transistors and three local bit line select lines by which the bank bit line LBx, the bank bit line LBx+1 and the bank bit line LBx+2 in the plurality of bank bit lines are independently connectable to the particular sense line. Likewise, for the second particular connection terminal there are three bank select transistors and three local ground select lines by which the bank bit line LBx, the bank bit line LBx−1 and the bank bit line LBx−2 in the plurality of bank bit lines are independently connectable to the particular ground line. This provides for independent connection of the bank bit lines to sense lines or ground lines for use as ground lines, sense lines or shielding lines during the reading of data from the device, or during other operations.

According to yet another aspect of invention, the bank select circuitry supports using fewer array bit lines as dedicated ground. In this aspect, for the second particular connection terminal on the particular array bit line, additional bank select transistors are coupled to the second particular connection terminal and additional local ground select lines are coupled to the additional bank select transistors. In this manner, the bank bit line LBx+2 and the bank bit line LBx+4 are independently connectable to the particular ground line, and the bank bit line LBx+3 is connectable to particular ground line. In a preferred implementation, for the second particular connection terminal, there are 6 local ground select lines and 6 bank select transistors by which the bank bit line LBx, the bank bit line LBx−1 and the bank bit line LBx−2, and the bank bit line LBx+2, the bank bit line LBx+3 and the bank bit line LBx+4 are independently connectable to a particular ground line.

According to another aspect to the invention, the bank select circuitry supports connection of adjacent pairs of bank bit lines to connection terminals for sense lines and ground lines in the plurality of array bit lines. Thus, for the first particular connection in this aspect of the invention, there are four bank select transistors and first and second local bit line select lines. The structure is connected so that the bank bit line LBx and the bank bit line LBx+2 are independently connectable to the particular sense line, and the bank bit line LBx+1 is connectable to the particular sense line. In this arrangement, the first bank select transistor is coupled between the first particular connection terminal and the bank bit line LBx, and controlled by the first local bit line select line. The second bank select transistor is coupled between the first particular connection terminal and the bank bit line LBx+1, and controlled by the first local bit line select line. The third bank select transistor is coupled between the second particular connection terminal and the bank bit line LBx+1, and controlled by the second local bit line select line. The fourth bank select transistor is coupled between the second particular connection terminal and the bank bit line LBx+2, and controlled by the second local bit line select line.

According to yet another aspect of the invention, the bank select circuitry supports the connection of multiple sense lines in the plurality of array bit lines such that the cells being sensed have separate bank bit lines which share a single ground line in the plurality of array bit lines. Thus, two sense amplifiers sharing a single ground line in the array allows for reading multiple columns of data out at the same time. In this aspect of the invention, for a third particular connection terminal in the plurality of connection terminals on a second particular sense line within the particular bank, a set of bank select transistors is connected by which the bank bit line LBx−2 and the bank bit line LBx−4 are independently connectable to the second particular sense line, and a bank bit line LBx−3 is connectable to the second particular sense line. Logic is included for controlling a connection of sense circuits to the sense lines in the plurality of array bit lines, and for controlling the local ground select lines and local bit line select lines. A sense circuit is connected to the first mentioned particular sense line and a sense circuit is connected to the second particular sense line. Two bank bit lines in a group including LBx through LBx−2 are coupled to the particular ground line, and one bank bit line adjacent one of the bank bit lines coupled to particular ground line and in a group including bank bit lines LBx through LBx+2 is coupled to the particular sense line, and one bank bit line adjacent another of the bank bit lines coupled to the particular ground line and in a group including bank bit line LBx−2 through LBx−4 is coupled to the second particular sense line.

According yet another aspect of the invention, the bank select transistors are implemented using the same manufacturing steps, and therefore have essentially the same structure, as the memory cells in the array. Thus, for a flat cell, mask ROM memory array, the bank select transistors are flat MOS transistors like the memory cells.

Other aspects and advantages of the present invention can be understood with reference to the figures, the detailed description and the claims which follow.

DETAILED DESCRIPTION

Figure 1:
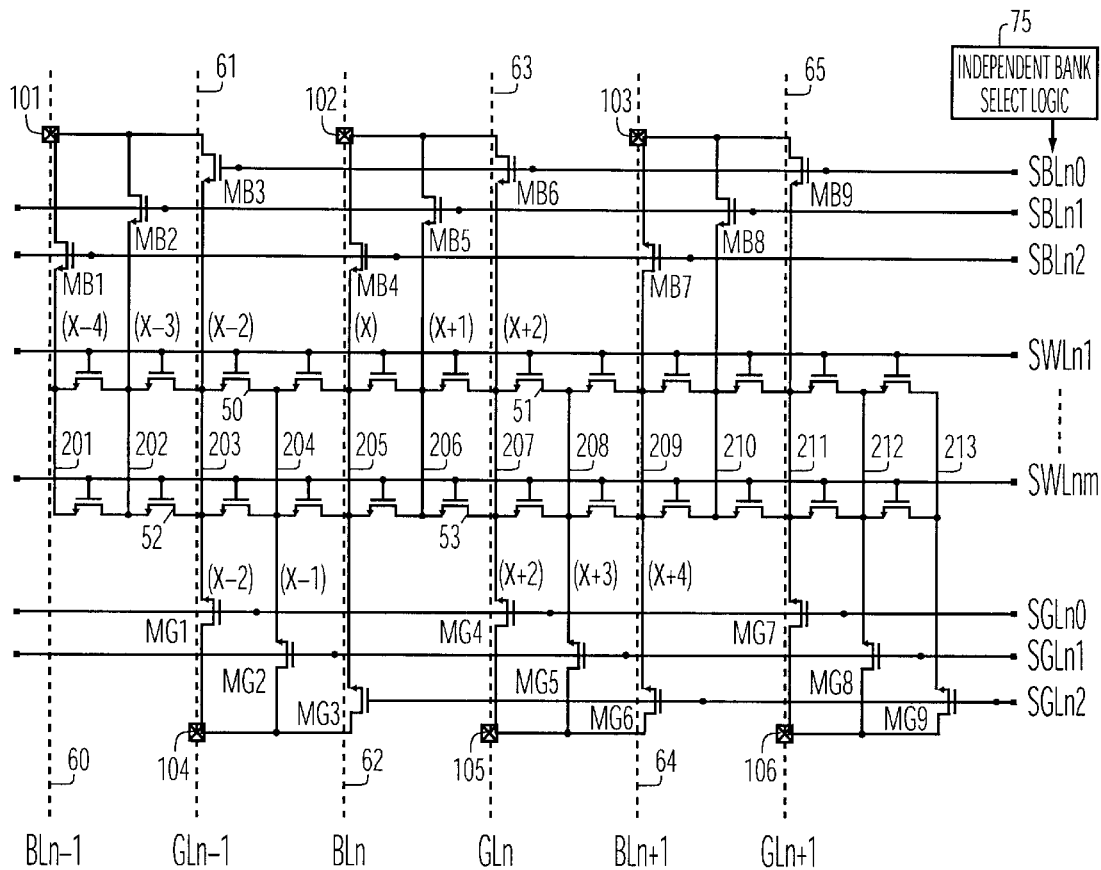
FIG. 1 is a diagram of a memory array including one example of bank select circuitry according to the present invention.

A detailed description of embodiments of the present invention is provided with respect FIGS. 1–11. FIG. 1 illustrates one example memory array including a bank select structure according to the present invention that provides for independently selecting the bank bit lines for connection to corresponding array bit lines. The array includes a plurality of rows and columns of memory cells, including representative cells 50 and 51 along a first row, and representative cells 52 and 53 along a second row. A word line SWLn1 is coupled to the memory cells along the first row, and a word line SWLnm is coupled to memory cells along the second row. In a preferred embodiment, there may be 32, 64 or 128 rows for example in a given bank. Bank bit lines 201–213 are coupled to the memory cells in the bank. For example the bank bit lines 202 and 203 are coupled to the memory cell 52. Bank bit lines 203 and 204 are coupled to memory cell 50. Overlying the array is a plurality of array bit lines 60–65. In this example the array bit lines 60, 62 and 64 are dedicated sense lines BLn−1 to, BLn and BLn+1 adapted for connection to sense amplifiers during readout of data in the array. The array bit lines 61, 63 and 65 are dedicated ground lines GLn−1, GLn and GLn+1. The sense lines BLn−1 to, BLn and BLn+1 include connection terminals 101, 102, 103 by which contact is made between the particular array bit line and a diffusion region in the substrate of the device. Likewise, the ground lines GLn−1, GLn and GLn+1 include connection terminals 104, 105, 106 by which contact is made between the particular array bit line and a diffusion region in the substrate of the device.

Bank select circuits are provided for establishing connection between the connection terminals on the array bit lines and the bank bit lines. In this embodiment, three bank select transistors MB1–MB3 are coupled to the connection terminal 101 for the sense line BLn−1. Bank select transistor MB1 is coupled to the bank bit line 201. Bank select transistor MB2 is coupled to the bank bit line 202. Bank select transistor MB3 is coupled to the bank bit line 203. The bank select transistors MB1–MB3 are coupled to respective local bit line select lines SBLn0–SBLn2, by which independent control of the connection of bank bit lines 201–203 to the connection terminal 101 is provided. In a similar manner, the connection terminal 102 on sense line BLn is coupled to bank select transistors MB4–MB6 for connection to bank bit lines 205–207 (LBx, LBx+1, LBx+2). Bank select transistors MB4–MB6 are coupled to respective local bit line select lines SBLn0–SBLn2. Connection terminal 103 on sense line BLn+1 is coupled to bank select transistors MB7–MB9, for connection to bank bit lines 209–211. Bank select transistors MB7–MB9 are coupled to respective local bit line select lines SBLn0–SBLn2.

Bank selection for ground lines in the plurality of array bit lines is controlled in a similar manner. Thus, connection terminal 104 on ground line GLn−1 is connected to bank bit lines 203–205 (LBx−2, LBx−1, LBx) through bank select transistors MG1–MG3 respectively. Bank select transistors MG1–MG3 are controlled by respective local ground select lines SGLn0–SGLn2. Connection terminal 105 on ground line GLn is connected to bank bit lines 207–209 (LBx+2, LBx+3, LBx+4) by respective bank select transistors MG4–MG6. The bank select transistors MG4–MG6 are controlled by respective local ground line select lines SGLn0–SGLn2. Likewise connection terminal 106 on ground line GLn+1 is coupled to bank bit lines 211–213 via bank select transistors MG7–MG9, which in turn are respectively controlled by the local ground line select lines SGLn0–SGLn2.

The bank select structure of the integrated circuit memory of FIG. 1 can be operated to select the memory cells in the array according to a variety of approaches. Logic 75 on the chip controls generation of the local bit line select lines and local ground select lines so that any combination of them may be asserted, individually or in combinations of more than one at a time to achieve a desired operation. This independent connectability allows the bank bit lines to be connected to the array bit lines in a flexible manner. The independent control over connection of the bank bit lines to the array bit lines, along with a constant number of transistors in the sensing path for establishing these connections provides significant flexibility in the design of control logic for the device. A variety of approaches to sensing particular memory cells is described perspective FIGS. 2–4 for the architecture of FIG. 1.

Figure 2:
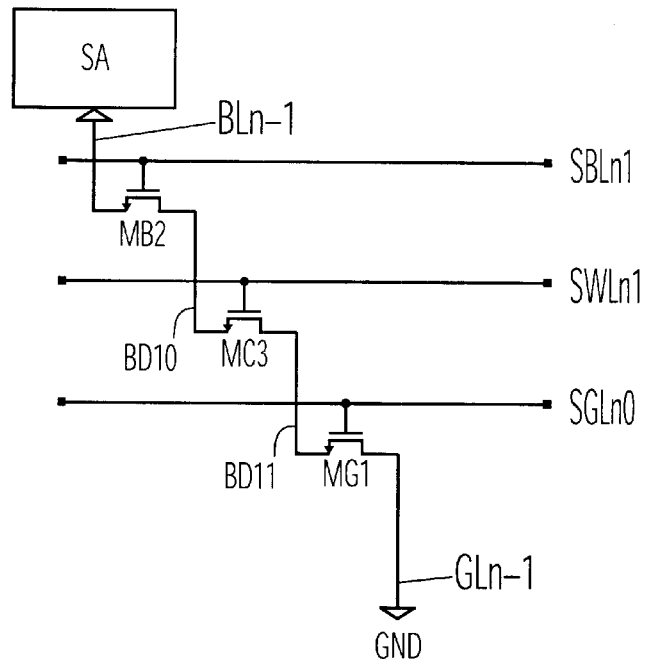
FIG. 2 is an abstract from FIG. 1 of a sensing path for a particular memory cell in the array.

FIG. 2 illustrates the sensing path for a memory cell MC3, which corresponds for example to memory cell 52 of FIG. 1, using the array bit line BLn−1 and the array ground line GLn−1. To access the memory cell MC3, the control signal on the local bit line select line SBLn1 is asserted, and the control signal on the local ground select line SGLn0 is asserted. There are three transistors in the sensing path between the array bit lines, including the bank select transistor MB2, the memory cell MC3, and the bank select transistor MG1. The sensing path includes the bank select transistor MB2, buried diffusion BD10 corresponding to the bank bit line 202, the memory cell MC3, the buried diffusion BD11 corresponding to bank bit line 203, and the bank select transistor MG1.

Figure 3:
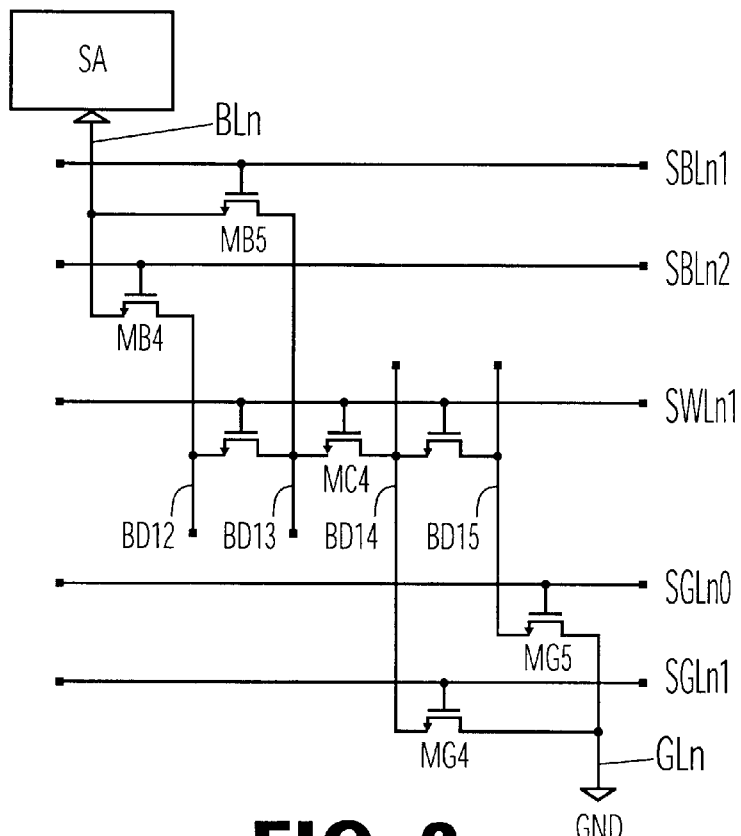
FIG. 3 is an abstract from FIG. 1 of another sensing path for a particular memory cell in the array.

FIG. 3 illustrates the operation of the bank select transistors for accessing a memory cell MC4, which corresponds for example to memory cell 53 of FIG. 1, and the use of the bank select structure to connect adjacent bank bit lines for shielding during the sensing operation. Thus in this example, the memory cell MC4 is connected between the array bit line BLn and the array ground line GLn. Signals on the local bit line select lines SBLn1 and SBLn2 are asserted, and signals on the local ground select lines SGLn0 and SGLn1 are asserted. This results in a sensing path from the array bit line BLn through the bank select transistor MB5 to the buried diffusion BD13 (corresponding to bank bit line 206) through memory cell MC4 to the buried diffusion BD14 (corresponding to bank bit line 207) and the bank select transistor MG4 to the array ground line GLn. The buried diffusion region BD12 (corresponding to the bank bit line 205) and adjacent to the buried diffusion region BD13 is connected to the array bit line BLn via bank select transistor MB4. Likewise, the buried diffusion region BD15 (corresponding to bank bit line 208) is connected to the array ground line GLn by the bank select transistor MG5. In this manner, the buried diffusion region BD12 and buried diffusion region BD15 provide for shielding of the sensing current.

Figure 4:
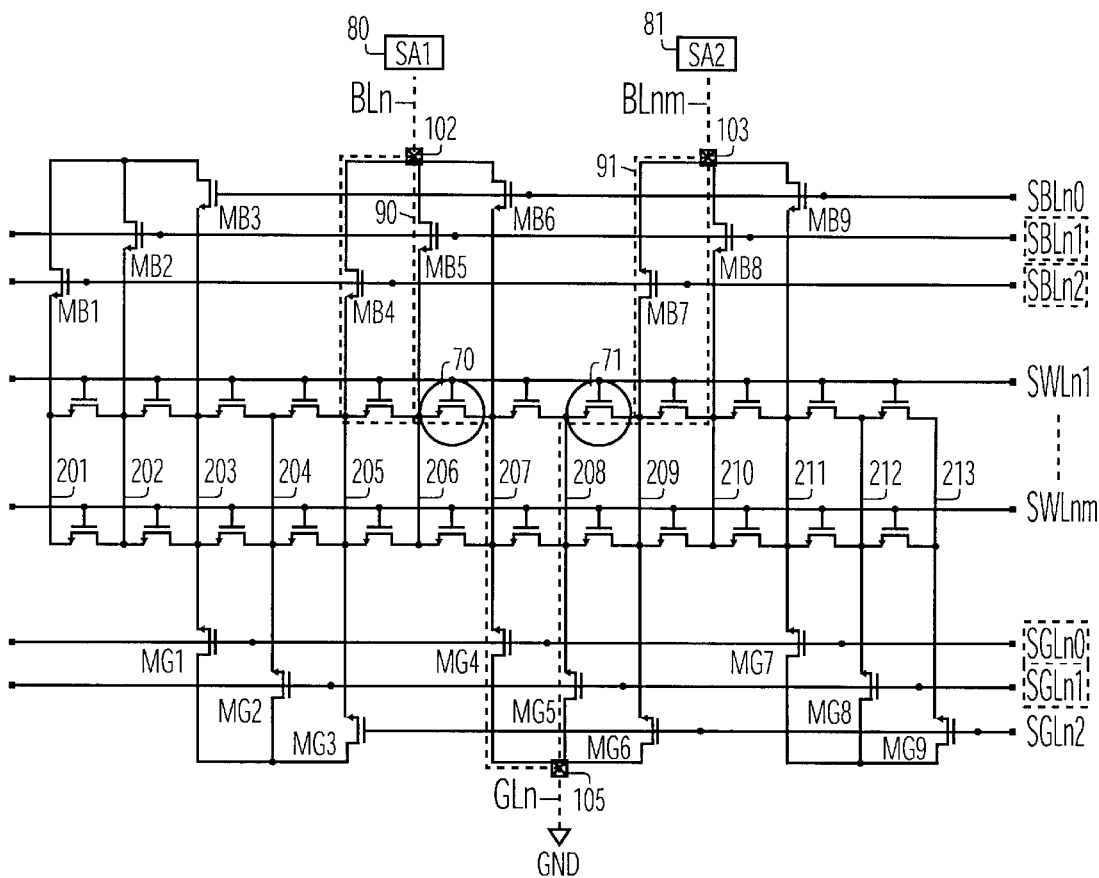
FIG. 4 illustrates the memory array of FIG. 1 configured for two sense amp—one ground line operation according to the present invention.

FIG. 4 illustrates yet another use of the flexible bank select structure of the present invention. In this example, the circuit is arranged for sensing of memory cells 70 and 71 using array bit lines BLn and BLn+1, and using shared array ground line GLn. As shown in FIG. 4 there is a set of sense amplifiers SA1 and SA2, and others not shown, which are selectively connectable to the array bit lines used for sensing data. In order to sense the memory cells 70 and 71, signals are asserted on the local bit line select lines SBLn1 and SBLn2, and signals are asserted on the local ground select lines SGLn0 and SGLn1. This results in a sensing current path shown by dotted line 90 for the memory cell 70 and a sensing current path shown by dotted line 91 for the memory cell 71. The current sensing path 90 for memory cell 70 includes the connection 102, bank select transistor MB5, the memory cell 70, the bank select transistor MG4 and the connection 105. The bank select transistor MB4 is also turned on, allowing the buried diffusion adjacent to the buried diffusion of the memory cell 70 to act as a shield, receiving the same precharge another biasing as the buried diffusion of the memory cell being sensed. The buried diffusion of the bank bit line 207 is coupled to the ground line Gln via bank select transistor MG4 and the connection 105.

The current sensing path 91 for the memory cell 71 includes the connection 103, bank select transistor MB7, memory cell 71, bank select transistor MG5 and connection 105. The bank select transistor MB8 establishes that the buried diffusion adjacent the buried diffusion of the memory cell 71 acts as a shield line. Bank bit line 207 and the bank bit line 208 are both coupled to the ground terminal 105 by rejecting bank select transition MG4 and MG5, and share the ground line GLn. However, the memory cells 70 and 71 being sensed do not share a buried diffusion bank bit line. This way, both memory cells can be sensed at the same time without a current loading problem on the local bank bit lines.

Figure 5:
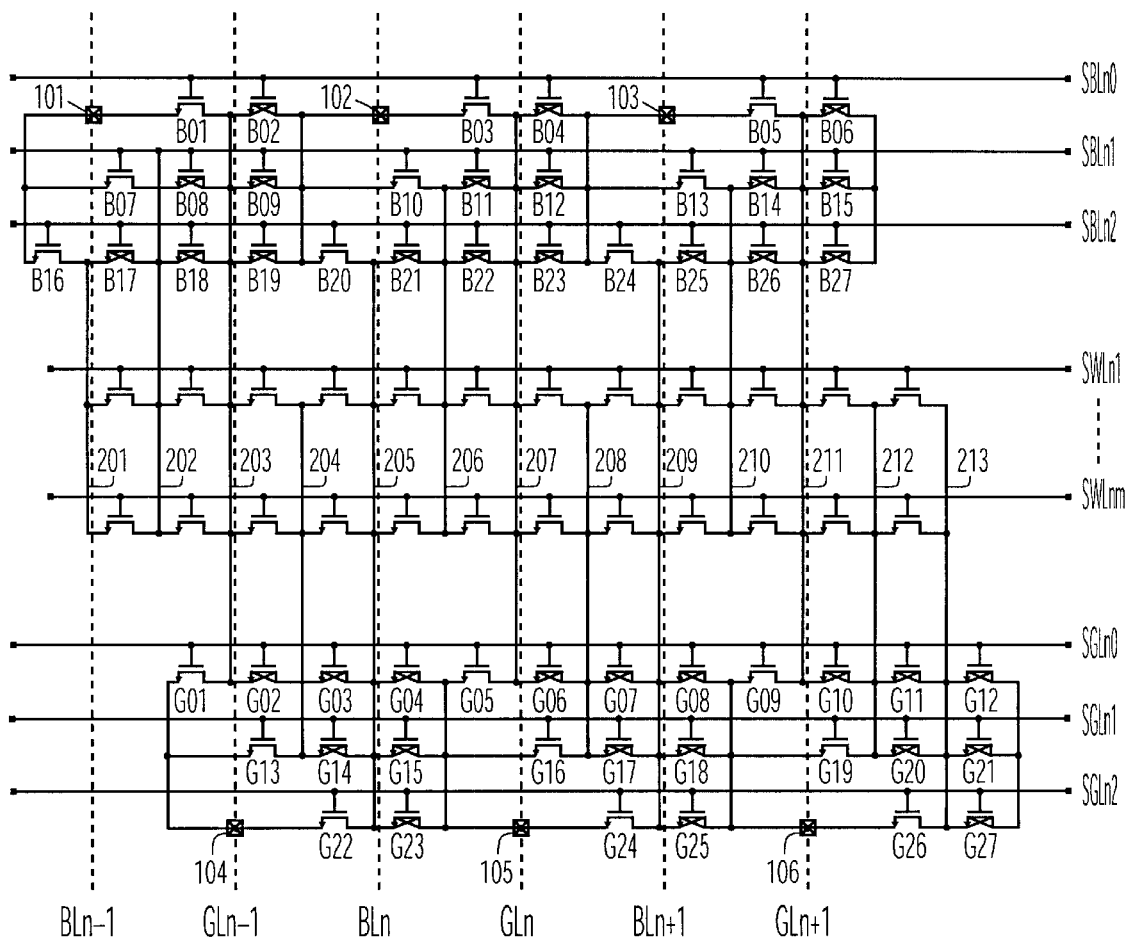
FIG. 5 is a more detailed circuit diagram of a memory array like that of FIG. 1, including flat cell bank select transistors.
Figure 6:
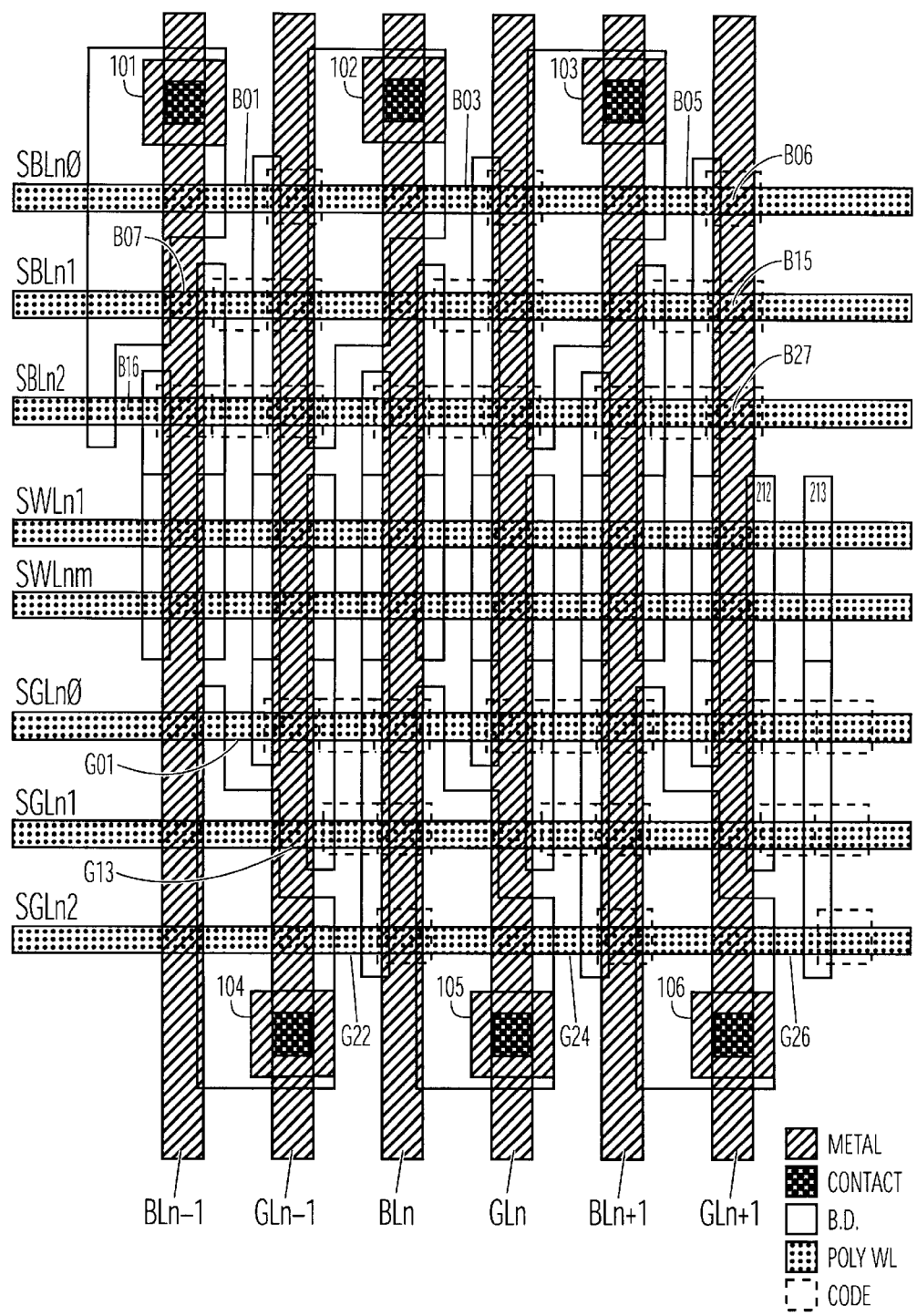
FIG. 6 illustrates a layout for the circuit of FIG. 5.

FIGS. 5 and 6 illustrate one implementation of the architecture of FIG. 1, in which the memory array comprises a flat cell mask ROM, and the bank select structure is implemented using mask ROM cells having essentially the same structure has the memory cells in the array. In FIG. 5, elements found in FIG. 1 are given the same reference numbers and not described again. The bank select structure includes a first sub array of ROM cells B01 through B27 which are used to implement the bank select transistors MB1 through MB9 of FIG. 1. The ROM cells B01 through B06 are coupled to the local bit line select line SBLn0. ROM cells B02, B04 and B06 are implanted to a high threshold state so that they are always off. ROM cells B01, B03 and B05 act as the bank select transistors MB3, MB6 and MB9, respectively. The ROM cells B07 through B15 are coupled to the local bit line select line SBLn1. ROM cells B08, B09, B11, B12, B14 and B15 are implanted to a high threshold state so that they are always off. ROM cells B07, B10 and B11 act as the bank select transistors MB2, MB5 and MB8, respectively. The ROM cells B16 through B27 are coupled to the local bit line select line SBLn2. ROM cells B17, B18, B19, B21, B22, B23, B25, B26 and B27 are implanted to a high threshold state so that they are always off. ROM cells B16, B20 and B24 act as the bank select transistors MB1, MB4 and MB7, respectively.

The bank select structure also includes a second sub array of ROM cells G01 through G27 which are used implement the bank select transistors MG1 through MG9 of FIG. 1. The ROM cells G01 through G12 are coupled to the local bit line select line SGLn0. ROM cells G02, G03, G04, G06, G07, G08, G10, G11 and G12 are implanted to a high threshold state so that they are always off. ROM cells G01, G05 and G09 act as the bank select transistors MG1, MG4 and MG7, respectively. The ROM cells G13 through G21 are coupled to the local bit line select line SGLn1. ROM cells G14, G15, G17, G18, G20 and G21 are implanted to a high threshold state so that they are always off. ROM cells G13, G16 and G19 act as the bank select transistors MG2, MG5 and MG8, respectively. The ROM cells G22 through G27 are coupled to the local bit line select line SGLn2. ROM cells G23, G25 and G27 are implanted to a high threshold state so that they are always off. ROM cells G22, G24 and G26 act as the bank select transistors MG3, MG6 and MG9, respectively.

FIG. 6 shows a layout for the circuit of FIG. 5. Structures in FIG. 6 which correspond to elements of FIG. 5 are given like reference numbers to facilitate comparison of the figures. In FIG. 6, the array bit lines comprise metal lines which overlie the array. The word lines and the bank line select lines comprise polysilicon under the array bit lines and over the substrate. The bank bit lines comprise buried diffusion regions in the substrate. Contacts in the connection terminals, such as terminal 101, connect the metal of the corresponding array bit line to an underlying contact diffusion region which acts as a source/drain terminal for the bank select transistors. The contact diffusion regions have a stepped shape as shown, and the bank bit lines extend into the notches created by the stepped shape, so that flat MOS transistors having the same structure as the memory cells in the array are formed under the bank select lines. ROM codes as indicated by the dash squares, set a number of the ROM cells formed using this bank select transistor structure to an always off state as described above.

Figure 7:
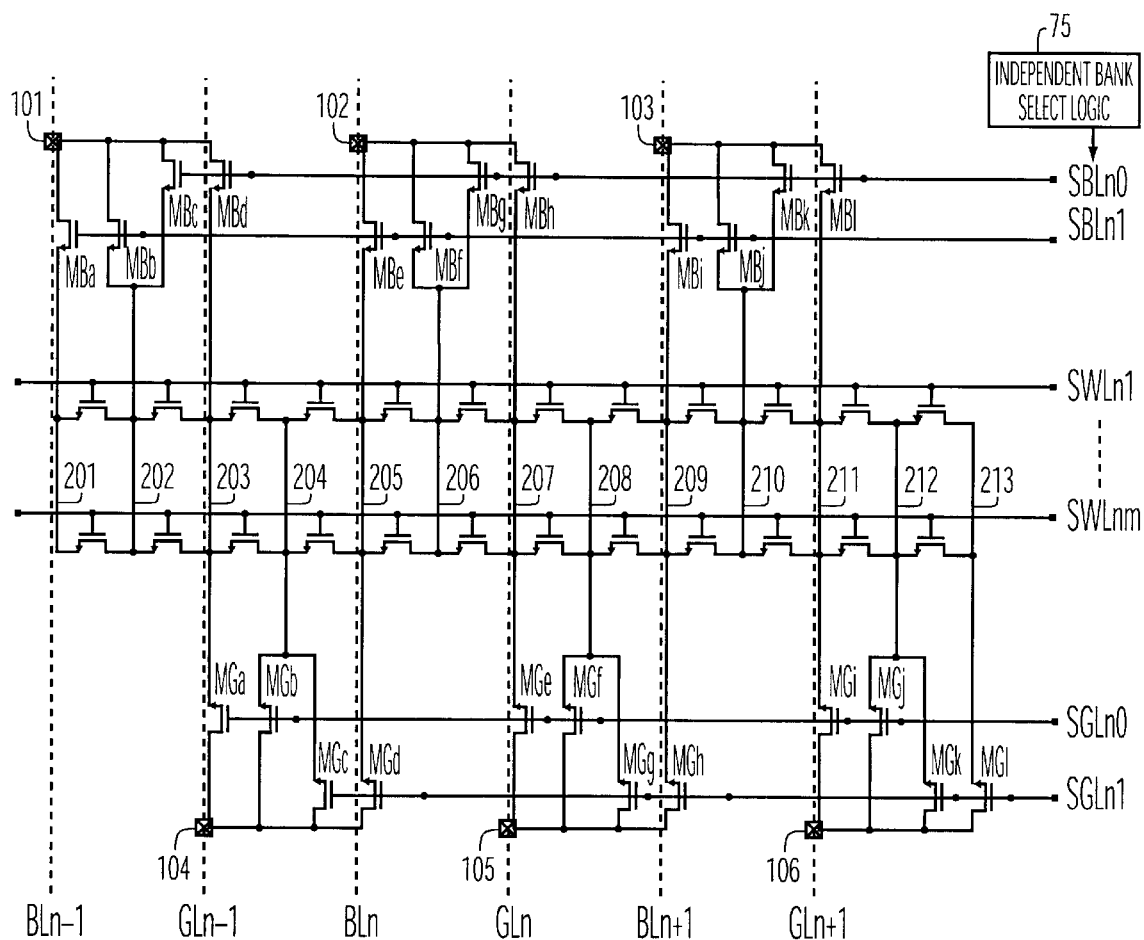
FIG. 7 is a diagram of a memory array including another example of bank select circuitry according to the present invention.

FIG. 7 illustrates yet another circuit design allowing flexible control of the connection of the bank bit lines to the array bit lines according to present invention. In the embodiment of FIG. 7, two neighbor bank bit lines for connection to a sense line and two neighbor bank bit lines for connection to a ground line are selected the same time, using a single local bit line select line or a single local ground select line. The structure of the array is like that of FIG. 1, and not described again.

The bank select circuitry for the connection terminal 101 includes four bank select transistors MBa through MBd. The bank select transistors MBa and MBb are coupled to the local bit line select line SBLn0. The bank select transistors MBc and MBd are coupled to the local bit line select line SBLn1. Likewise, for connection terminal 102, the bank select circuitry includes four bank select transistors MBe through MBh. The bank select transistors MBe and MBf are coupled to the local bit line select line SBLn0. The bank select transistors MBg and MBh are coupled to the local bit line select line SBLn1. For connection terminal 103, the bank 30 select circuitry includes four bank select transistors MBi through MB1. The bank select transistors MBi and MBj are coupled to the local bit line select line SBLn0. The bank select transistors MBk and MB1 are coupled to the local bit line select line SBLn1.

The bank select circuitry for the connection terminal 104 includes four bank select transistors MGa through MGd. The bank select transistors MGa and MGb are coupled to the local ground select line SGLn0. The bank select transistors MGc and MGd are coupled to the local ground select line SGLn1. Likewise, for connection terminal 105, the bank select circuitry includes four bank select transistors MGe through MGh. The bank select transistors MGe and MGf are coupled to the local ground select line SGLn0. The bank select transistors MGg and MGh are coupled to the local ground select line SGLn1. For connection terminal 106, the bank select circuitry includes four bank select transistors MGi through MGl. The bank select transistors MGi and MGj are coupled to the local ground select line SGLn0. The bank select transistors MGk and MGl are coupled to the local ground select line SGLn1.

For the structure of FIG. 7, by selecting the array sense line BLn, the array ground line GLn and the bank select lines SBLn1 and SGLn0, cells between bank bit lines 206 and 207 can be sensed. By selecting the array sense line BLn, the array ground line GLn and the bank select lines SBLn0 and SGLn1, cells between the bank bit lines 207 and 208 can be sensed. In order to use this structure for two sense amplifiers and one ground line operation, the array sense line BLn can be selected for a first sense amplifier, the array ground line GLn can be selected for ground, the array sense line BLn+1 can be selected for a second sense amplifier, and the bank select lines SBLn1 and SGLn0 are selected to read cells between the bank bit lines 206 and 207, and cells between the bank bit lines 208 and 209 at the same time.

Logic 75 on the chip controls generation of the local bit line select lines and local ground select lines so that any combination of them may be asserted, one at a time or more than one at a time to achieve a desired operation.

Figure 8:
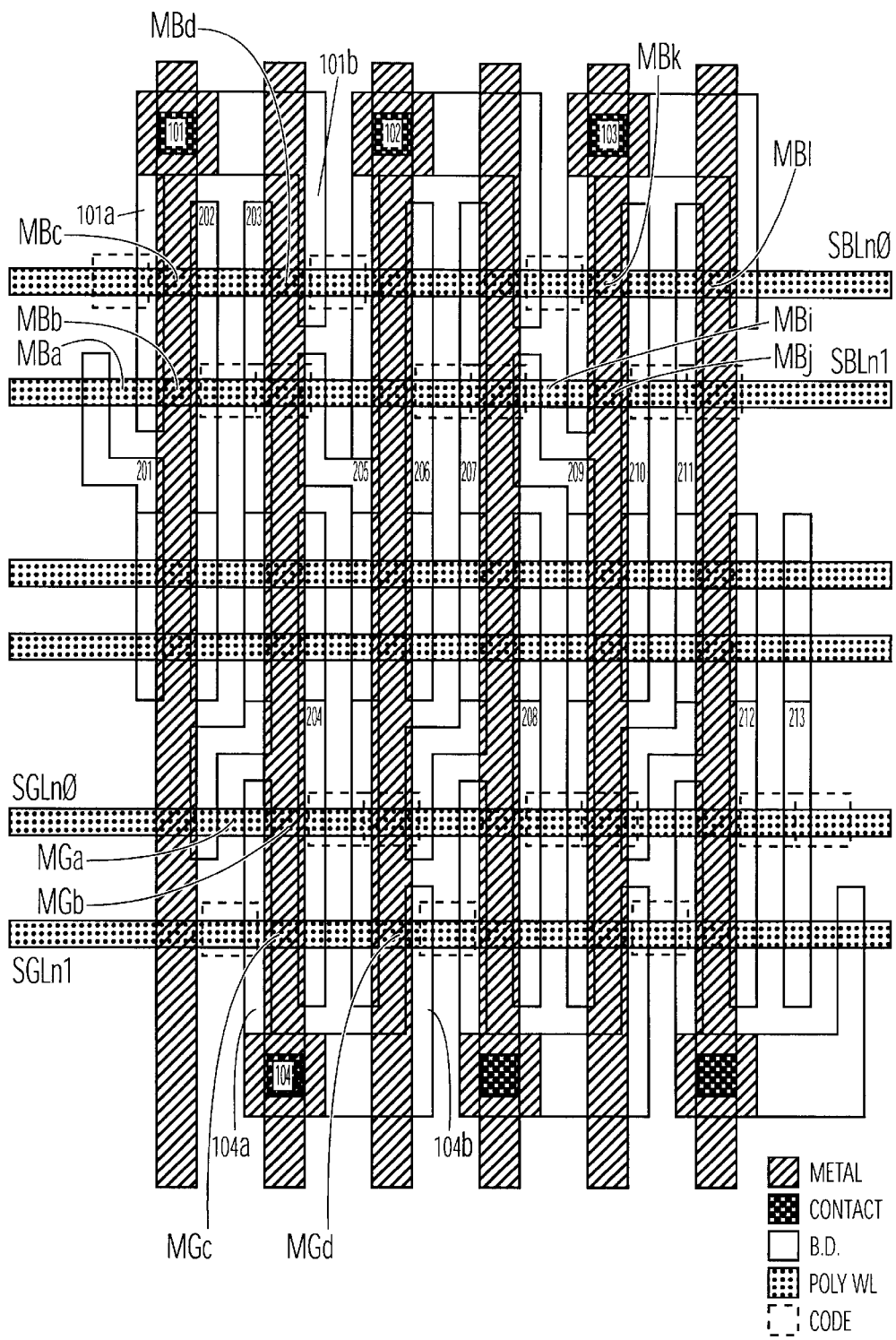
FIG. 8 illustrates a layout for the circuit of FIG. 7.
Figure 9:
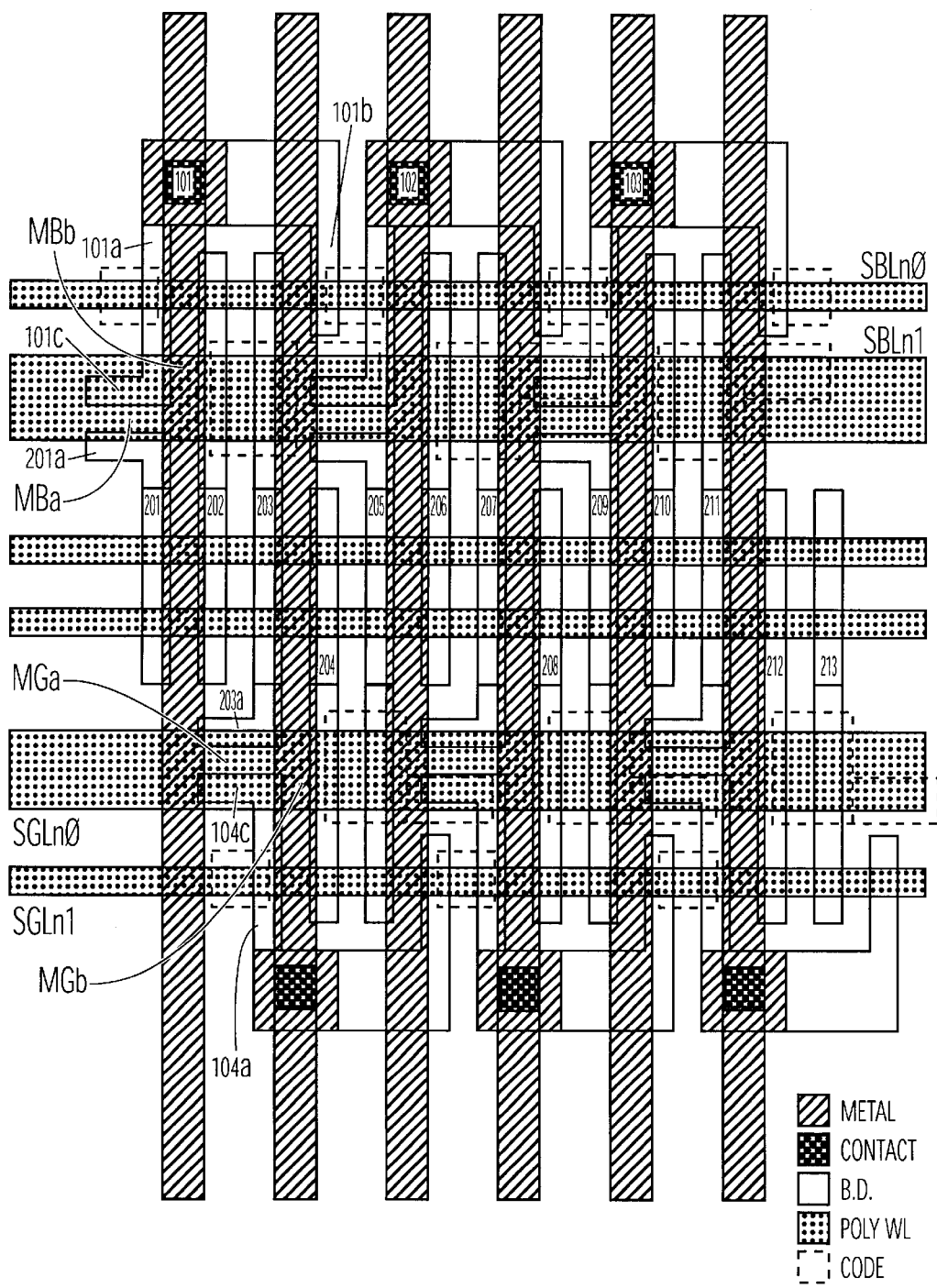
FIG. 9 illustrates an alternative layout for the circuit of FIG. 7.

FIGS. 8 and 9 show alternative layouts for the circuit of FIG. 7. Structures in FIGS. 8 and 9 which correspond to elements of FIG. 7 are given like reference numbers to facilitate comparison of the figures. In FIGS. 8 and 9, the array bit lines comprise metal lines which overlie the array. The word lines and the bank line select lines comprise polysilicon under the array bit lines and over the substrate. The bank bit lines comprise buried diffusion regions in the substrate. Contacts in the connection terminals, such as terminal 101, connect the metal of the corresponding array bit line to an underlying contact diffusion region which acts as a source/drain terminal for the bank select transistors.

ROM code implants in the dashed squares (e.g. 99) set thresholds high in the transistor structures at which they are implanted to block formation of unwanted bank select transistors.

Buried diffusion regions in the contact terminals 101, 102, 103 for the array sense lines have an upside down "U" shape with one side 101a of the "U" being longer than the other side 101b. The buried diffusion bank bit lines 201, 205, 209 extend to near the end of the longer side (101a) of a contact terminal, and then horizontally over and up to align with the shorter side of an adjacent contact terminal diffusion (e.g. buried diffusion bank bit line 105 extends over to align with the shorter side 101b of an adjacent contact terminal). Buried diffusion bank bit lines 202, 203, 206, 207, 210, 211 extend between the sides of the "U." Buried diffusion bank bit lines 204, 208, 212 extend up to near the horizontal extension of the adjacent buried diffusion bank bit lines 205, 209. Bank select transistors MBa and MBb are formed between the longer side 101 a of the contact terminal 101 and the buried diffusion bank bit lines 201 and 202 under the local bit line select line SBLn1. Bank select transistors MBc and MBd are formed between the sides of the "U" and the buried diffusion bank bit lines 202 and 203, respectively, under the local bit line select line SBLn0.

Buried diffusion regions in the contact terminal 104, 105, 106 for the array ground lines have an "U" shape with one side 104a of the "U" being longer than the other side 104b. The buried diffusion bank bit lines 203, 207, 211 extend to near the end of the longer side (104a) of a contact terminal, and then horizontally over and down to align with the shorter side of an adjacent contact terminal diffusion (e.g. buried diffusion bank bit line 207 extends over to align with the shorter side 104b of an adjacent contact terminal). Buried diffusion bank bit lines 201, 204, 205, 208, 209, 212, 213 extend between the sides of the "U." Buried diffusion bank bit lines 202, 206, 210 extend down to near the horizontal extension of the adjacent buried diffusion bank bit lines 203, 207, 211. Bank select transistors MGa and MGb are formed between the longer side 104a of the contact terminal 104 and the buried diffusion bank bit lines 203 and 204 under the local ground select line SGLn0. Bank select transistors MGc and MGd are formed between the sides of the "U" and the buried diffusion bank bit lines 204 and 205, respectively, under the local ground select line SGLn1.

FIG. 9 illustrates an alternative layout for the circuit of FIG. 7. The layout is similar in many respects to the layout of FIG. 8, and only certain differences are described here. In the layout of FIG. 9, the buried diffusion contact terminal 101 has an upside down "U" shape, with one side 101a longer than the other side 101b. In addition, the contact terminal 101 includes a serif 101c extending horizontally to the left from the lower end of the longer side 101a of the "U." Also, the buried diffusion bank bit line 201 includes a horizontal serif 201a adjacent, and spaced apart by a channel region from the horizontal serif 101c of the contact terminal. Also, the local bank bit line select line SBLn1 is broad enough to overly the channel region between the serifs 101c and 201a to establish bank select transistor MBa. Also, the bit line select line SBLn1 overlies a space between the buried diffusion bank bit line 202 and the longer side 101a of the contact terminal 101, forming bank select transistor MBb. The contact terminal 104 on the array ground line has a similar structure, with serif 104c and serif 203a under local ground select line SGLn0 forming bank select transistor MBa. Bank select transistor MBb is formed by the longer side 104a of the contact terminal and the local buried diffusion bank bit line 204 under the local ground select line SGLn0.

The layout of FIG. 9 is more compact than that of FIG. 8, at the cost of one irregular bank select transistor, having a channel direction different from the other selection transitions and the memory cells.

Figure 10:
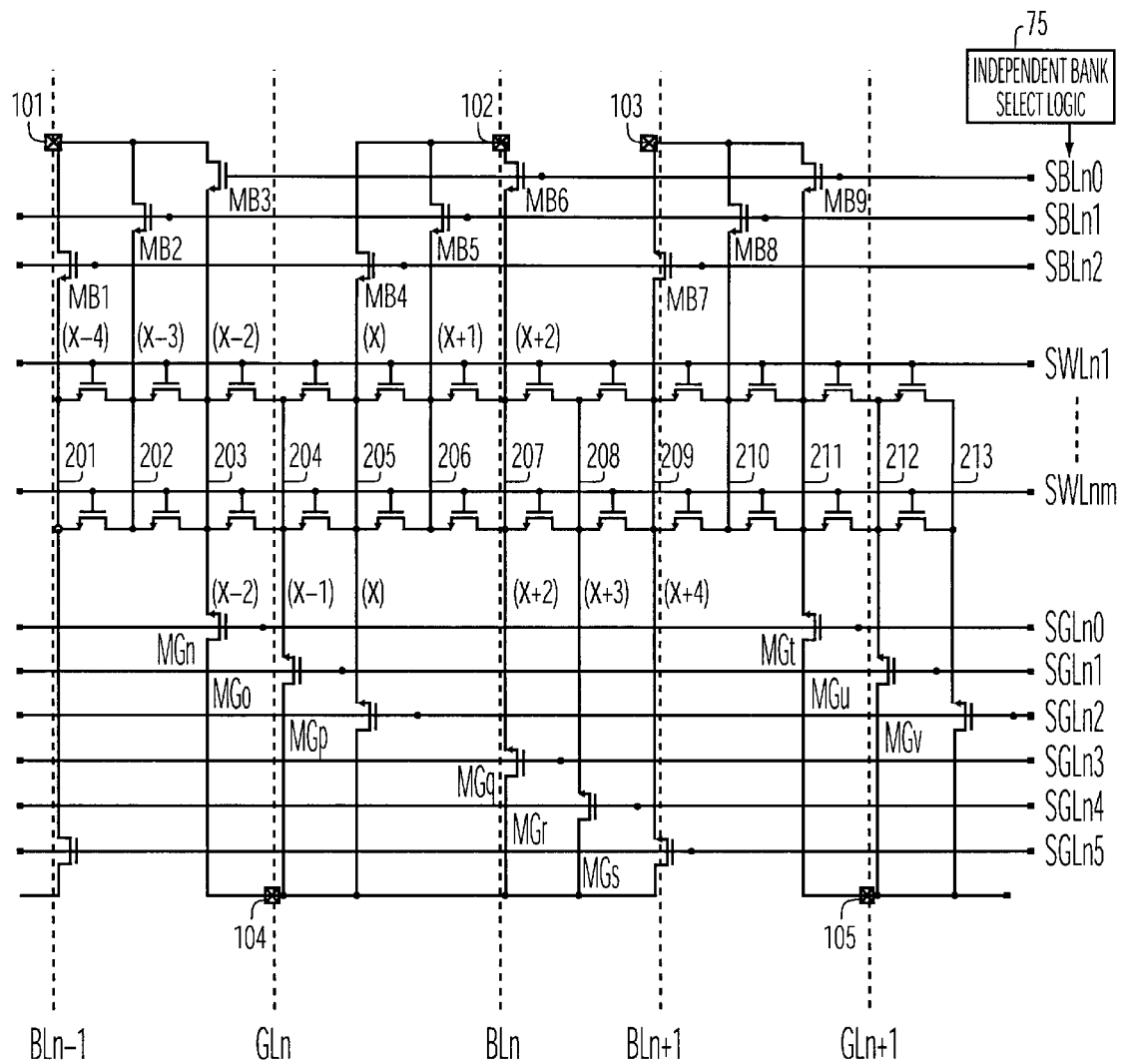
FIG. 10 is a diagram of a memory array including yet another example of bank select circuitry according to the present invention, extending the bank select structure of FIG. 1 for shared array ground lines.

FIG. 10 the illustrates a circuit design for an array of nonvolatile memory cells a having yet another alternative implementation of bank select circuitry according to the present invention. In FIG. 10, the bank select circuitry shares a connection terminal for an array ground line among more than 3 bank bit lines. This allows for the use of the fewer metal array bit lines as ground lines, and reduces the stress of metal pitch on the density of the memory array. In the example of FIG. 10, the bank select lines which are normally served by two ground lines are served by one ground line. Three additional bank ground select lines are added to the circuit. Thus, the components of FIG. 10 which are identical to those of FIG. 1 are given like reference numbers and not described again. The bank select structure for the ground lines is changed. Thus, connection terminal 104 is coupled to six bank select transistors MGn through MGs. Bank select transistor MGn is coupled to the bank bit line 203 and controlled by local ground select line SGLn0; bank select transistor MGo is coupled to the bank bit line 204 and controlled by local ground select line SGLn1; bank select transistor MGp is coupled to the bank bit line 205 and controlled by local ground select line SGLn2; bank select transistor MGq is coupled to the bank bit line 207 and controlled by local ground select line SGLn3; bank select transistor MGr is coupled to bank bit line 208 and controlled by local ground select line SGLn4; and bank select transistor MGs is coupled to bank bit line 209 and controlled by local ground select line SGLn5. The pattern repeats for connection terminal 105 and for other terminals on the device.

Figure 11:
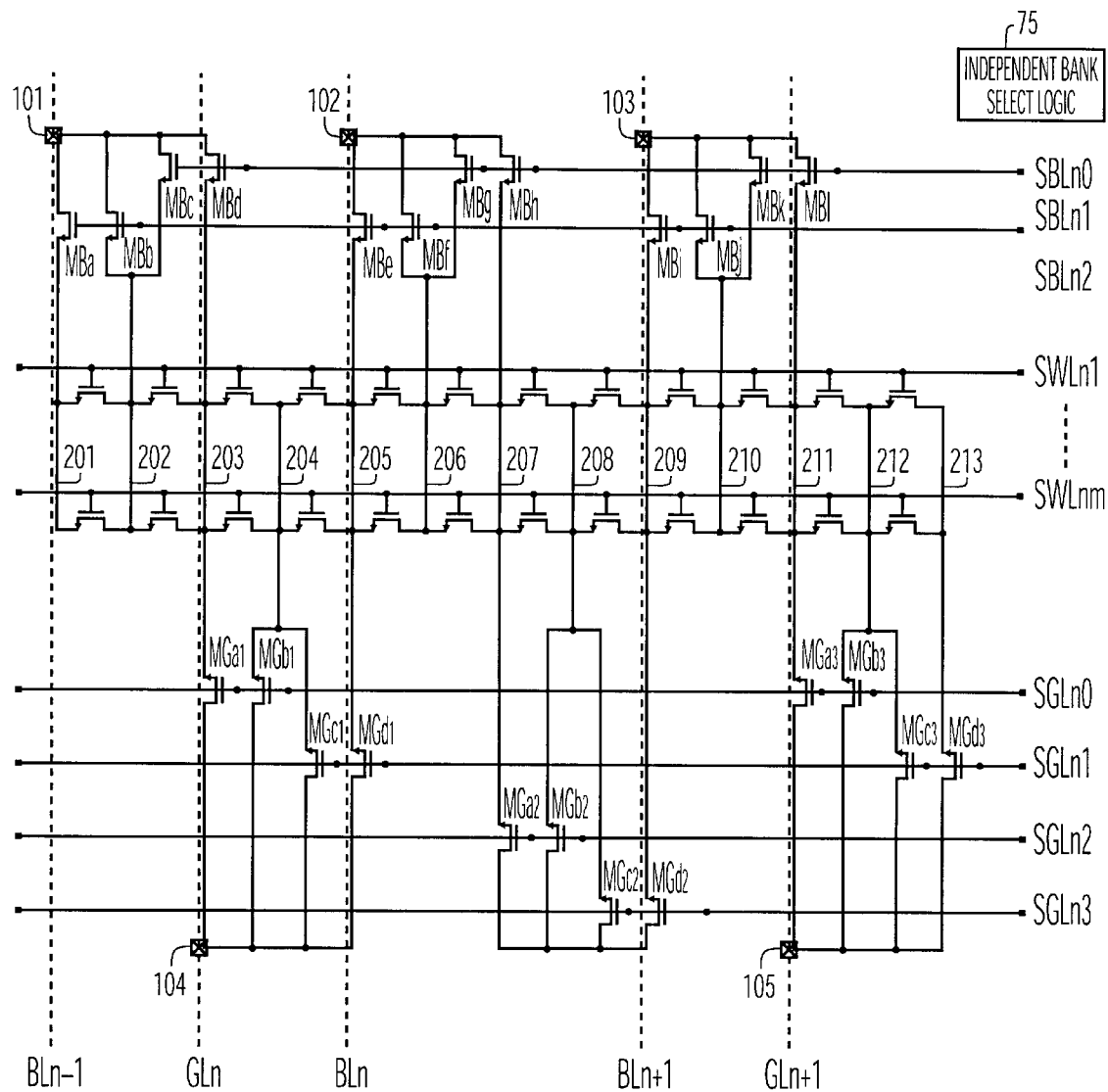
FIG. 11 is a diagram of a memory array including yet another example of bank select circuitry according to the present invention, extending the bank select structure of FIG. 7 for shared array ground lines.

This technique for sharing array ground lines can be extended to other bank select structures, such as the structure of FIG. 7. FIG. 11 illustrates one such extension of the embodiment of FIG. 7 to a shared ground line configuration. In FIG. 11, the bank select circuitry shares a connection terminal for an array ground line among more than 3 bank bit lines. This allows for the use of the fewer metal array bit lines as ground lines, and reduces the stress of metal pitch on the density of the memory array. In the example of FIG. 11, the bank select lines which are normally served by two ground lines are served by one ground line. Two additional bank ground select lines are added to the circuit. Thus, the components of FIG. 11 which are identical to those of FIG. 7 are given like reference numbers and not described again. The bank select structure for the ground lines is changed. Thus, connection terminal 104 is coupled to eight bank select transistors MGa1, MGb1, MGc1, MGd1, MGa2, MGb2, MGc2 and MGd2. Bank select transistor MGa1 is coupled to the bank bit line 203 and controlled by local ground select line SGLn0; bank select transistor MGb1 is coupled to the bank bit line 204 and controlled by local ground select line SGLn0; bank select transistor MGc1 is coupled to the bank bit line 204 and controlled by local ground select line SGLn1; bank select transistor MGd1 is coupled to the bank bit line 205 and controlled by local ground select line SGLn1; bank select transistor MGa2 is coupled to bank bit line 207 and controlled by local ground select line SGLn2; and bank select transistor MGb2 is coupled to bank bit line 208 and controlled by local ground select line SGLn2. Bank select transistor MGc2 is coupled to bank bit line 208 and controlled by local ground select line SGLn3; and bank select transistor MGd2 is coupled to bank bit line 209 and controlled by local ground select line SGLn3. The pattern repeats for connection terminal 105 and for other terminals on the device.

The embodiments described above are particularly suited to high density, flat cell mask ROM devices. However, the bank select structures may be applied to a variety of other memory devices. Also, in the embodiments described, the array ground lines and the array sense lines as dedicated for one use or the other. In alternative implementations of the present invention, the array bit lines may be switched for use as either sense lines or ground lines.

The foregoing description of various embodiments of the invention have been presented or purposes of illustration and description. The description is not intended to limit the invention o the precise forms disclosed. Many modifications and equivalent arrangements will be pparent to people skilled in the art.

What is claimed is:

1. An integrated circuit memory, comprising:
    an array of memory cells arranged in rows and columns, and including a plurality of banks;
    a plurality of word lines along the plurality of rows;
    a plurality of array bit lines arranged along the plurality of columns and extending across the array, the array bit lines including sense lines and ground lines;
    a plurality of bank bit lines arranged along the plurality of columns, bank bit lines extending across corresponding banks in the plurality of banks, and coupled to memory cells in the corresponding banks;
    a plurality of connection terminals coupled to the array bit lines, including for each array bit line at least one connection terminal per bank in the plurality of banks; and
    a plurality of bank select transistors, banks select transistors operable to selectively connect respective bank bit lines to corresponding connection terminals, including
        for a first particular connection terminal in the plurality of connection terminals on a particular sense line in the plurality of array bit lines and within a particular bank, bank select transistors coupled to the first particular connection terminal and local bit line select lines coupled to the bank select transistors, respectively, by which a bank bit line LBx, and a bank bit line LBx+2 in the plurality of bank bit lines are connectable, individually and in combination, to the particular sense line, and a bank bit line LBx+1 is connectable to the particular sense line, and
        for a second particular connection terminal in the plurality of connection terminals on a particular ground line in the plurality of array bit lines and within the particular bank, bank select transistors coupled to the second particular connection terminal and local ground select lines coupled to the bank select transistors, respectively, by which the bank bit line LBx and a bank bit line LBx−2 in the plurality of bank bit lines are connectable, individually and in combination, to the particular ground line, and bank bit line LBx−1 is connectable to the particular ground line.

2. The integrated circuit memory of claim 1, including for the second particular connection terminal in the plurality of connection terminals on the particular ground line, additional bank select transistors coupled to the second particular connection terminal and additional local ground select lines coupled to the additional bank select transistors, respectively, by which the bank bit line LBx+2 and a bank bit line LBx+4 in the plurality of bank bit lines are connectable, individually and in combination, to the particular ground line, and the bank bit line LBx+3 is connectable to the particular ground line.

3. The integrated circuit memory of claim 2, wherein for the second particular connection terminal there are six bank select transistors and six local ground select lines by which the bank bit line LBx, the bank bit line LBx−1, the bank bit line LBx−2, the bank bit line LBx+2, the bank bit line LBx+3 and the bank bit line LBx+4 in the plurality of bank bit lines are connectable, individually and in combination, to the particular ground line.

4. The integrated circuit memory of claim 1, wherein for the first particular connection terminal there are three bank select transistors and three local bit line select lines by which the bank bit line LBx, the bank bit line LBx+1and the bank bit line LBx+2 in the plurality of bank bit lines are connectable, individually and in combination, to the particular sense line.

5. The integrated circuit memory of claim 4, wherein for the second particular connection terminal there are three bank select transistors and three local ground select lines by which the bank bit line LBx, the bank bit line LBx−1 and the bank bit line LBx−2 in the plurality of bank bit lines are connectable, individually and in combination, to the particular ground line.

6. The integrated circuit memory of claim 1, wherein for the first particular connection terminal there are four bank select transistors and first and second local bit line select lines by which the bank bit line LBx, and the bank bit line LBx+2 in the plurality of bank bit lines are connectable, individually and in combination, to the particular sense line and the bank bit line LBx+1 is connectable to the particular sense line, wherein the first bank select transistor is coupled between the first particular connection terminal and bank bit line LBx, and controlled by the first local bit line select line, the second bank select transistor is coupled between the first particular connection terminal and bank bit line LBx+1, and controlled by the first local bit line select line, the third bank select transistor is coupled between the first particular connection terminal and bank bit line LBx+1, and controlled by the second local bit line select line, and the fourth bank select transistor is coupled between the first particular connection terminal and bank bit line LBx+2, and controlled by the second local bit line select line.

7. The integrated circuit memory of claim 6, wherein for the second particular connection terminal there are four bank select transistors and first and second local ground select lines by which the bank bit line LBx, and the bank bit line LBx−2 in the plurality of bank bit lines are connectable, individually and in combination, to the particular sense line and the bank bit line LBx−1 is connectable to the particular sense line, wherein the first bank select transistor is coupled between the second particular connection terminal and bank bit line LBx, and controlled by the first local ground select line, the second bank select transistor is coupled between the second particular connection terminal and bank bit line LBx−1, and controlled by the first local ground select line, the third bank select transistor is coupled between the second particular connection terminal and bank bit line LBx−1, and controlled by the second local ground select line, and the fourth bank select transistor is coupled between the second particular connection terminal and bank bit line LBx−2, and controlled by the second local ground select line.

8. The integrated circuit memory of claim 1, including:
    for a third particular connection terminal in the plurality of connection terminals on a second particular sense line in the plurality of array bit lines and within the particular bank, bank select transistors coupled to the third particular connection terminal and local bit line select lines coupled to the bank select transistors, respectively, by which abankbit line LBx−2, and a bank bit line LBx−4 in the plurality of bank bit lines are connectable, individually and in combination, to the second particular sense line, and a bank bit line LBx−3 is connectable to the second particular sense line; and a set of sense circuits selectively connectable to the sense lines in the plurality of array bit lines; and logic to generate signals on the local bit line select lines and on the local ground select lines, and to connect sense circuits in the set of sense circuits to the particular sense line and the second particular sense line, such that two bank bit lines in a group including bank bit line LBx through LBx−2 are coupled to the particular ground line, and one bank bit line, adjacent one of the bank bit lines coupled to the particular ground line, and in a group including bank bit line LBx through LBx+2 is coupled to the particular sense line, and one bank bit line, adjacent the other of the bank bit lines coupled to the particular ground line, and in a group including bank bit line LBx−2 through LBx−4 is coupled to the second particular sense line.

9. The integrated circuit memory of claim 1, wherein said plurality of bank bit lines comprises a plurality of diffusion regions.

10. The integrated circuit memory of claim 1, wherein said plurality of array bit lines comprises a plurality of metal lines.

11. The integrated circuit memory of claim 1, wherein the memory cells comprise flat ROM cells.

12. The integrated circuit memory of claim 1, wherein the memory cells comprise flat ROM cells and the bank select transistors coupled to the first particular connection terminal comprise flat ROM cells.

13. The integrated circuit memory of claim 1, wherein the memory cells have a structure, and the bank select transistors have essentially the same structure.

14. The integrated circuit memory of claim 1, wherein the memory cells comprise on-volatile memory cells.

15. An integrated circuit memory, comprising:
an array of ROM cells arranged in rows and columns, and including a plurality of banks;
a plurality of word lines along the plurality of rows;
a plurality of array bit lines arranged along the plurality of columnns and extending across the array, the array bit lines including sense lines and ground lines;
a plurality of buried diffusion bank bit lines arranged along the plurality of columns, bank bit lines extending across corresponding banks in the plurality of banks, and coupled to memory cells in the corresponding banks;
a plurality of connection terminals coupled to the array bit lines, including for each array bit line at least one connection terminal per bank in the plurality of banks; and
a plurality of bank select transistors, banks select transistors operable to selectively connect respective bank bit lines to corresponding connection terminals, including
for a first particular connection terminal in the plurality of connection terminals on a particular sense line in the plurality of array bit lines and within a particular bank, three bank select transistors coupled to the first particular connection terminal and three local bit line select lines coupled to the three bank select transistors, respectively, by which a bank bit line LBx, a bank bit line LBx+1 and a bank bit line LBx+2 in the plurality of bank bit lines are connectable, individually and in combination, to the particular sense line, and for a second particular connection terminal in the plurality of connection terminals on a particular ground line in the plurality of array bit lines and within the particular bank, three bank select transistors coupled to the second particular connection terminal and three local ground select lines coupled to the three bank select transistors, respectively, by which the bank bit line LBx, a bank bit line LBx−1, and a bank bit line LBx−2 in the plurality of bank bit lines are connectable, individually and in combination, to the particular ground line.

16. The integrated circuit memory of claim 15, wherein for the second particular connection terminal there are six bank select transistors and six local ground select lines by which the bank bit line LBx, the bank bit line LBx−1, the bank bit line LBx−2, the bank bit line LBx+2, the bank bit line LBx+3 and the bank bit line LBx+4 in the plurality of bank bit lines are connectable, individually and in combination, to the particular ground line.

17. The integrated circuit memory of claim 15, wherein the bank select transistors coupled to the first particular connection terminal comprise flat ROM cells.

18. An integrated circuit memory, comprising:
an array of memory cells arranged in rows and columns, and including a plurality of banks;
a plurality of word lines along the plurality of rows;
a plurality of array bit lines arranged along the plurality of columns and extending across the array, the array bit lines including array sense lines and array ground lines;
a plurality of bank bit lines arranged along the plurality of columns, bank bit lines extending across corresponding banks in the plurality of banks, and coupled to memory cells in the corresponding banks;
a plurality of connection terminals coupled to the array bit lines, including for each array bit line at least one connection terminal per bank in the plurality of banks; and
a bank select structure operable to selectively connect respective bank bit lines to corresponding connection terminals, including circuitry for connecting first and second bank bit lines to a single connection terminal for an array ground line, and for connecting a third bank bit line adjacent the first bank bit line to a second connection terminal for a first array sense line, and a fourth bank bit line adjacent the second bank bit line to a third connection terminal for a second array sense line; and
a set of sense amplifiers selectively connectable to array bit lines in the plurality of array bit lines, the set including sense amplifiers connectable in parallel to the first array sense line and the second array sense line.

19. The integrated circuit memory of claim 18, wherein the bank select structure comprises a plurality of bank select transistors, banks select transistors operable to selectively connect respective bank bit lines to corresponding connection terminals, including
for a first particular connection terminal in the plurality of connection terminals on a first particular sense line in the plurality of array bit lines and within a particular bank, bank select transistors coupled to the first particular connection terminal and local bit line select lines coupled to the bank select transistors, respectively, by which a bank bit line LBx, and a bank bit line LBx+2 in the plurality of bank bit lines are connectable, individually and in combination, to the particular sense line, and a bank bit line LBx+1 is connectable to the first particular sense line, for a second particular connection terminal in the plurality of connection terminals on a particular ground line in the plurality of array bit lines and within the particular bank, bank select transistors coupled to the second particular connection terminal and local ground select lines coupled to the bank select transistors, respectively, by which the bank bit line LBx and a bank bit line LBx–2 in the plurality of bank bit lines are connectable, individually and in combination, to the particular ground line, and bank bit line LBx–1 is connectable to the particular ground line, and for a third particular connection terminal in the plurality of connection terminals on a second particular sense line in the plurality of array bit lines and within the particular bank, bank select transistors coupled to the third particular connection terminal and local bit line select lines coupled to the bank select transistors, respectively, by which a bank bit line LBx–2, and a bank bit line LBx–4 in the plurality of bank bit lines are connectable, individually and in combination, to the second particular sense line, and a bank bit line LBx–3 is connectable to the second particular sense line.

20. The integrated circuit memory of claim 19, wherein said plurality of bank bit lines comprises a plurality of diffusion regions.

21. The integrated circuit memory of claim 18, wherein said plurality of array bit lines comprises a plurality of metal lines.

22. The integrated circuit memory of claim 18, wherein the memory cells comprise flat ROM cells.

23. The integrated circuit memory of claim 18, wherein the memory cells comprise flat ROM cells and the bank select transistors coupled to the first particular connection terminal comprise flat ROM cells.

24. The integrated circuit memory of claim 18, wherein the memory cells have a structure, and the bank select transistors have essentially the same structure.

25. The integrated circuit memory of claim 18, wherein the memory cells comprise non-volatile memory cells.

26. An integrated circuit memory, comprising:

an array of non-volatile memory cells arranged in rows and columns, and including a plurality of banks;

a plurality of word lines along the plurality of rows;

a plurality of array bit lines arranged along the plurality of columns and extending across the array, the array bit lines including sense lines and ground lines;

a plurality of bank bit lines arranged along the plurality of columns, bank bit lines extending across corresponding banks in the plurality of banks, and coupled to memory cells in the corresponding banks;

a plurality of connection terminals coupled to the array bit lines, including for each array bit line at least one connection terminal per bank in the plurality of banks; and a plurality of bank select transistors, banks select transistors operable to selectively connect respective bank bit lines to corresponding connection terminals, including for a first particular connection terminal in the plurality of connection terminals on a particular sense line in the plurality of array bit lines and within a particular bank, four bank select transistors coupled to the first particular connection terminal and first and second local bit line select lines coupled to the bank select transistors, respectively, by which a bank bit line LBx, and a bank bit line LBx+2 in the plurality of bank bit lines are connectable, individually and in combination, to the particular sense line and a bank bit line LBx+1 is connectable to the particular sense line, wherein the first bank select transistor is coupled between the first particular connection terminal and bank bit line LBx, and controlled by the first local bit line select line, the second bank select transistor is coupled between the first particular connection terminal and bank bit line LBx+1, and controlled by the first local bit line select line, the third bank select transistor is coupled between the first particular connection terminal and bank bit line LBx+1, and controlled by the second local bit line select line, and the fourth bank select transistor is coupled between the first particular connection terminal and bank bit line LBx+2, and controlled by the second local bit line select line, and for a second particular connection terminal in the plurality of connection terminals on a particular ground line in the plurality of array bit lines and within the particular bank, bank select transistors coupled to the second particular connection terminal and local ground select lines coupled to the bank select transistors, respectively, by which the bank bit line LBx and a bank bit line LBx–2 in the plurality of bank bit lines are connectable, individually and in combination, to the particular ground line, and bank bit line LBx–1 is connectable to the particular ground line.

27. The integrated circuit memory of claim 26, wherein for the second particular connection terminal there are first, second, third and fourth bank select transistors and first and second local ground select lines by which the bank bit line LBx, and the bank bit line LBx–2 in the plurality of bank bit lines are connectable, individually and in combination, to the particular sense line and the bank bit line LBx–1 is connectable to the particular sense line, wherein the first bank select transistor is coupled between the second particular connection terminal and bank bit line LBx, and controlled by the first local ground select line, the second bank select transistor is coupled between the second particular connection terminal and bank bit line LBx–1, and controlled by the first local ground select line, the third bank select transistor is coupled between the second particular connection terminal and bank bit line LBx–1, and controlled by the second local ground select line, and the fourth bank select transistor is coupled between the second particular connection terminal and bank bit line LBx–2, and controlled by the second local ground select line.

28. The integrated circuit memory of claim 27, wherein for the second particular connection terminal there are fifth, sixth, seventh and eighth bank select transistors and third and fourth local ground select lines by which the bank bit line LBx, the bank bit line LBx–2, the bank bit line LBx+2, and the bank bit line LBx+4 in the plurality of bank bit lines are connectable, individually and in combination, to the particular ground line, and the bank bit line LBx–1and the bank bit line LBx+3 are connectable to the particular ground line.

29. The integrated circuit memory of claim 26, including:

for a third particular connection terminal in the plurality of connection terminals on a second particular sense line in the plurality of array bit lines and within the particular bank, bank select transistors coupled to the third particular connection terminal and local bit line select lines coupled to the bank select transistors, respectively, by which a bank bit line LBx–2, and a bank bit line LBx−4 in the plurality of bank bit lines are connectable, individually and in combination, to the second particular sense line, and a bank bit line LBx−3 is connectable to the second particular sense line; and a set of sense circuits selectively connectable to the sense lines in the plurality of array bit lines; and logic to generate signals on the local bit line select lines and on the local ground select lines, and to connect sense circuits in the set of sense circuits to the particular sense line and the second particular sense line, such that two bank bit lines in a group including bank bit line LBx through LBx−2 are coupled to the particular ground line, and one bank bit line, adjacent one of the bank bit lines coupled to the particular ground line, and in a group including bank bit line LBx through LBx+2 is coupled to the particular sense line, and one bank bit line, adjacent the other of the bank bit lines coupled to the particular ground line, and in a group including bank bit line LBx−2 through LBx−4 is coupled to the second particular sense line.

30. The integrated circuit memory of claim 26, wherein said plurality of bank bit lines comprises a plurality of diffusion regions.

31. The integrated circuit memory of claim 26, wherein said plurality of array bit lines comprises a plurality of metal lines.

32. The integrated circuit memory of claim 26, wherein the non-volatile memory cells comprise flat ROM cells.

33. The integrated circuit memory of claim 26, wherein the non-volatile memory cells comprise flat ROM cells and the bank select transistors coupled to the first particular connection terminal comprise flat ROM cells.

34. The integrated circuit memory of claim 26, wherein the non-volatile memory cells have a structure, and the bank select transistors have essentially the same structure.

35. A bank select transistor structure for a memory array including a plurality of local diffusion lines, comprising:

a contact terminal, the contact terminal comprising a diffusion region having essentially a U-shape with a base area extending horizontally between a first leg and a second leg, the first and second legs extending vertically from the base area and having respective distal ends, the distal end of the first leg including a serif extending horizontally outward;

first through third diffusion lines in the plurality of diffusion lines of the memory array extending vertically and having respective proximal ends near the contact terminal, the proximal end of the first diffusion line having a serif extending essentially parallel to the serif on the distal end of the first leg of the contact terminal, the proximal ends of second diffusion line and the third diffusion line extending to near the base area of contact terminal;

a first word line structure extending horizontally over the first leg and second leg between the base area and the distal ends of the first and second legs of the contact terminal, and extending over the second and third diffusion lines near the respective proximal ends;

a second word line structure extending parallel to the first word line structure over a channel region between the serif on the distal end of the first leg and the serif on the proximal end of the first diffusion line, and over the first leg near the serif on the first leg and over the second and third diffusion lines;

an implant in a region between the second and third diffusion lines under the second word line structure to cause the region to remain non-conductive when the second word line structure receives a word line voltage, whereby a word line voltage on the first word line structure connects the second and third diffusion lines to the contact terminal, and a word line voltage on the second word line structure connects the first and second diffusion lines to the contact terminal.

36. A bank select transistor structure for a memory array including a plurality of local diffusion lines, comprising:

a contact terminal, the contact terminal comprising a diffusion region having essentially a U-shape with a base area extending horizontally between a first leg and a second leg, the first and second legs extending vertically from the base area and having respective distal ends;

first through third diffusion lines in the plurality of diffusion lines of the memory array extending vertically and having respective proximal ends near the contact terminal, the proximal end of the first diffusion line having an extension extending horizontally outward for a channel width and vertically essentially parallel to the distal end of the first leg of the contact terminal, the proximal ends of second diffusion line and the third diffusion line extending to near the base area of contact terminal;

a first word line structure extending horizontally over the first leg and second leg between the base area and the distal ends of the first and second legs of the contact terminal, and extending over the second and third diffusion lines near the respective proximal ends;

a second word line structure extending parallel to the first word line structure over extension of the first diffusion line and over the first leg, and over the second and third diffusion lines;

an implant in a region between the second and third diffusion lines under the second word line structure to cause the region to remain non-conductive when the second word line structure receives a word line voltage, whereby a word line voltage on the first word line structure connects the second and third diffusion lines to the contact terminal, and a word line voltage on the second word line structure connects the first and second diffusion lines to the contact terminal.

* * * * *